United States Patent
Ohsaki

(10) Patent No.: US 9,443,867 B2
(45) Date of Patent: Sep. 13, 2016

(54) METHOD OF MAKING DAMASCENE SELECT GATE IN MEMORY DEVICE

(71) Applicant: SANDISK TECHNOLOGIES INC., Plano, TX (US)

(72) Inventor: Shingo Ohsaki, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/699,631

(22) Filed: Apr. 29, 2015

(65) Prior Publication Data

US 2015/0318300 A1    Nov. 5, 2015

Related U.S. Application Data

(60) Provisional application No. 61/986,204, filed on Apr. 30, 2014.

(51) Int. Cl.
*H01L 27/115* (2006.01)
*H01L 21/28* (2006.01)
*H01L 21/311* (2006.01)
(Continued)

(52) U.S. Cl.
CPC ... *H01L 27/11582* (2013.01); *H01L 21/02164* (2013.01); *H01L 21/02208* (2013.01); *H01L 21/02532* (2013.01); *H01L 21/02595* (2013.01); *H01L 21/28* (2013.01); *H01L 21/28273* (2013.01); *H01L 21/28282* (2013.01); *H01L 21/311* (2013.01); *H01L 21/31111* (2013.01); *H01L 21/31144* (2013.01); *H01L 21/321* (2013.01); *H01L 21/3212* (2013.01); *H01L 21/3213* (2013.01); *H01L 21/32115* (2013.01); *H01L 21/32133* (2013.01); *H01L 27/1157* (2013.01); *H01L 27/11524* (2013.01); *H01L 27/11556* (2013.01)

(58) Field of Classification Search
None
See application file for complete search history.

(56) References Cited

U.S. PATENT DOCUMENTS 5,915,167 A    6/1999 Leedy
8,026,138 B2 *  9/2011 Lee ................... H01L 27/10875
                                                257/E27.095

(Continued)

OTHER PUBLICATIONS

Katsumata, R. et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137, (2009).

(Continued)

*Primary Examiner* — Alexander Ghyka
(74) *Attorney, Agent, or Firm* — The Marbury Law Group PLLC

(57) ABSTRACT

A method of fabricating a memory device includes forming a mask over a top surface of a stack of alternating insulating material layers and control gate electrodes located over a substrate, wherein the stack has a memory opening extending vertically through the stack, a semiconductor channel extends vertically in the memory opening, and a memory film is located in the memory opening between the semiconductor channel and the plurality of control gate electrodes, and the mask covers a first portion of an upper insulating layer of the stack and exposes a second portion of the upper insulating layer adjacent to the memory opening, etching the upper insulating layer through the mask to provide a recess in the second portion of the upper insulating layer, and forming a conductive material within the recess to provide a select gate electrode adjacent to the semiconductor channel in the memory opening.

24 Claims, 9 Drawing Sheets

(51) Int. Cl.
*H01L 21/321* (2006.01)
*H01L 21/3213* (2006.01)
*H01L 21/02* (2006.01)

(56) References Cited

U.S. PATENT DOCUMENTS

| | | | | |
|---|---|---|---|---|
| 8,187,936 | B2 | 5/2012 | Alsmeier et al. | |
| 8,294,131 | B2* | 10/2012 | Kim | H01L 27/10876 257/2 |
| 8,349,681 | B2 | 1/2013 | Alsmeier et al. | |
| 2012/0168848 | A1* | 7/2012 | Ahn | H01L 21/28282 257/324 |
| 2013/0109158 | A1* | 5/2013 | Lee | H01L 27/11582 438/488 |
| 2015/0064885 | A1* | 3/2015 | Lee | H01L 27/11556 438/488 |
| 2015/0099338 | A1* | 4/2015 | Yoo | H01L 29/7926 438/268 |
| 2015/0287735 | A1* | 10/2015 | Jeon | H01L 27/1157 257/324 |
| 2016/0049423 | A1* | 2/2016 | Yoo | H01L 27/11573 257/324 |

OTHER PUBLICATIONS

U.S. Appl. No. 14/133,979, filed Dec. 19, 2013, SanDisk Technologies Inc.
U.S. Appl. No. 14/468,644, filed Aug. 26, 2014, SanDisk Technologies Inc.
U.S. Appl. No. 14/468,744, filed Aug. 26, 2014, SanDisk Technologies Inc.
U.S. Appl. No. 62/004,990, filed May 30, 2014, SanDisk Technologies Inc.
Endoh et al., "Novel Ultra High Density Memory with a Stacked-Surrounding Gate Transistor (S-SGT) Structured Cell," IEDM Proc. (2001) 33-36.

* cited by examiner

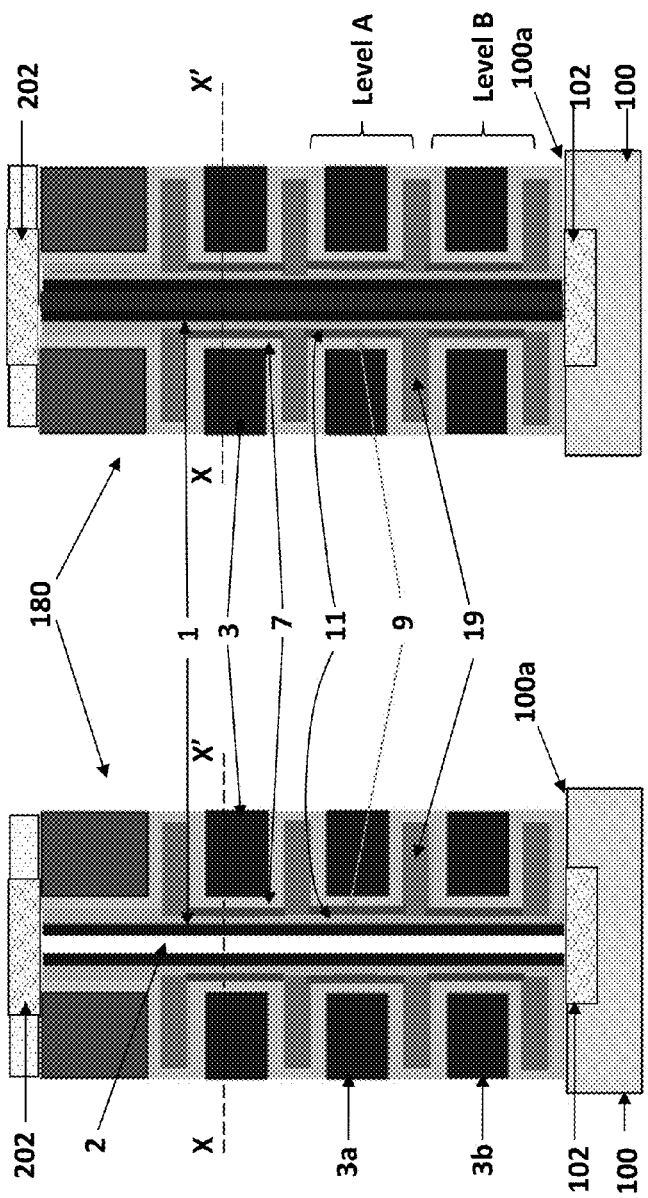
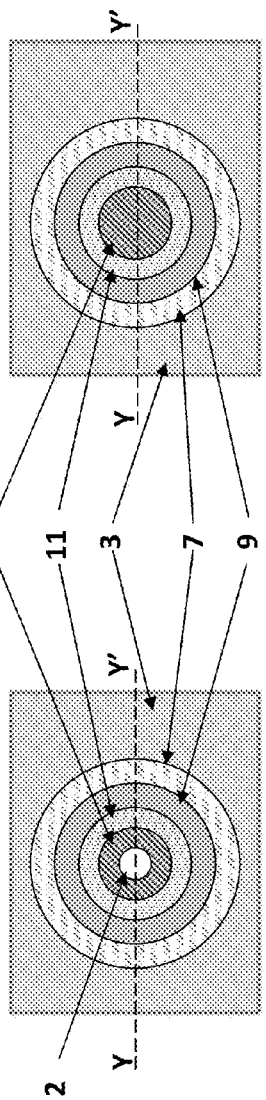
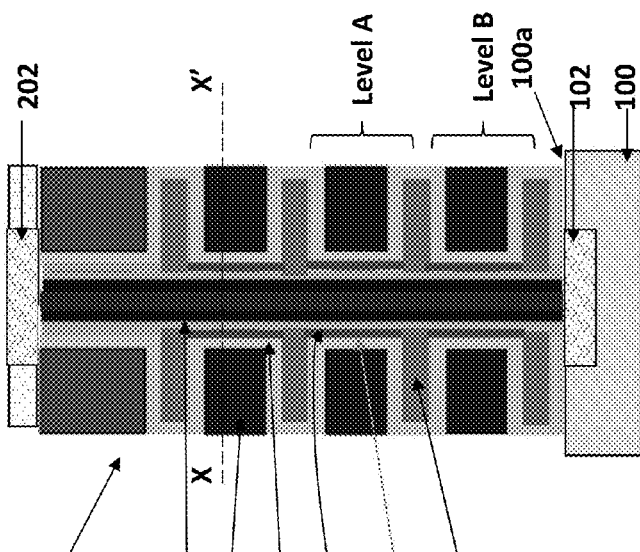
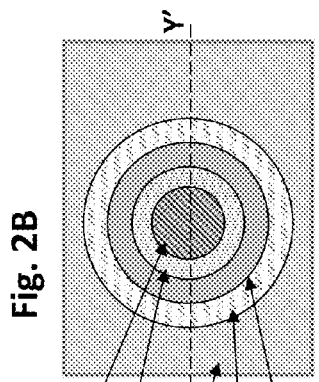
Fig. 1A Fig. 2A
Fig. 1B Fig. 2B

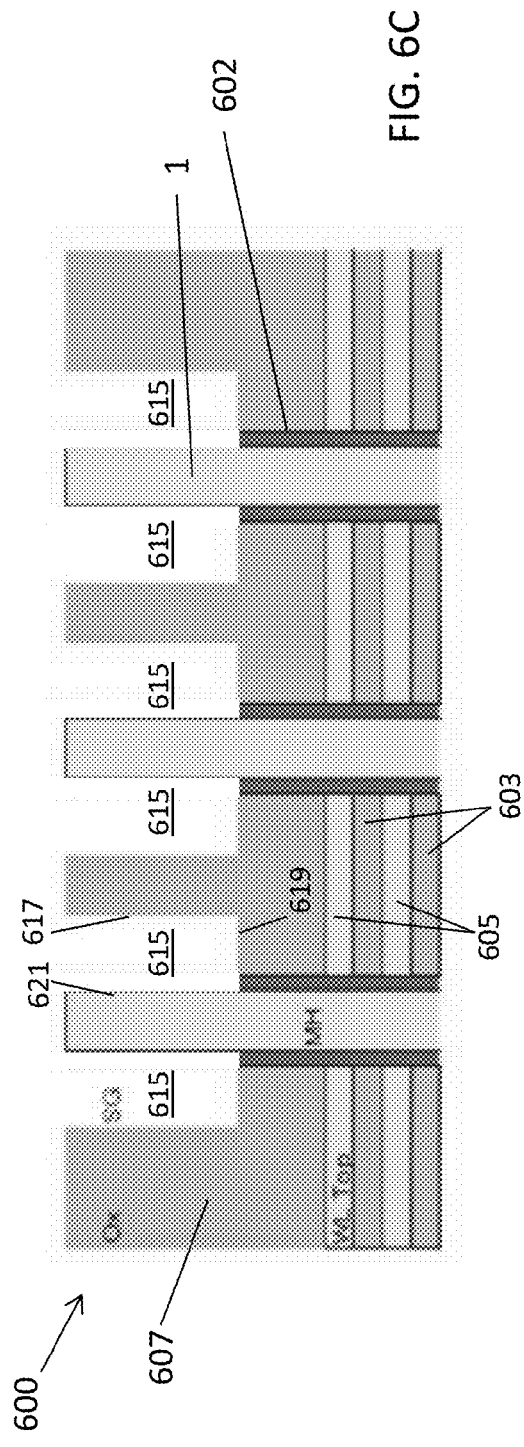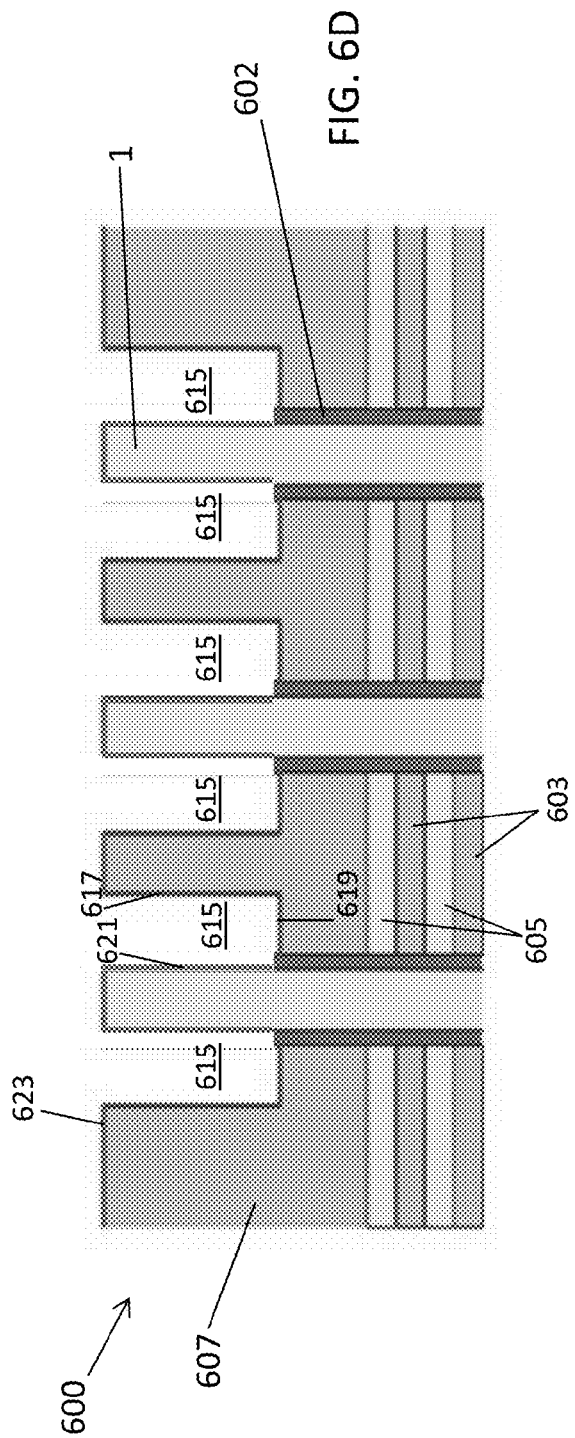

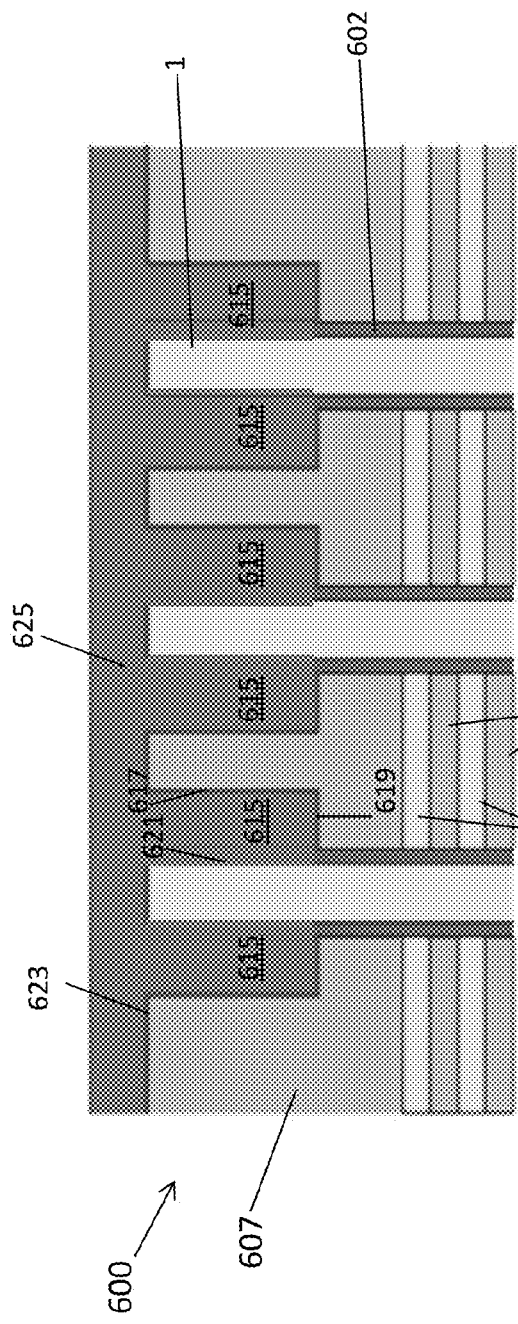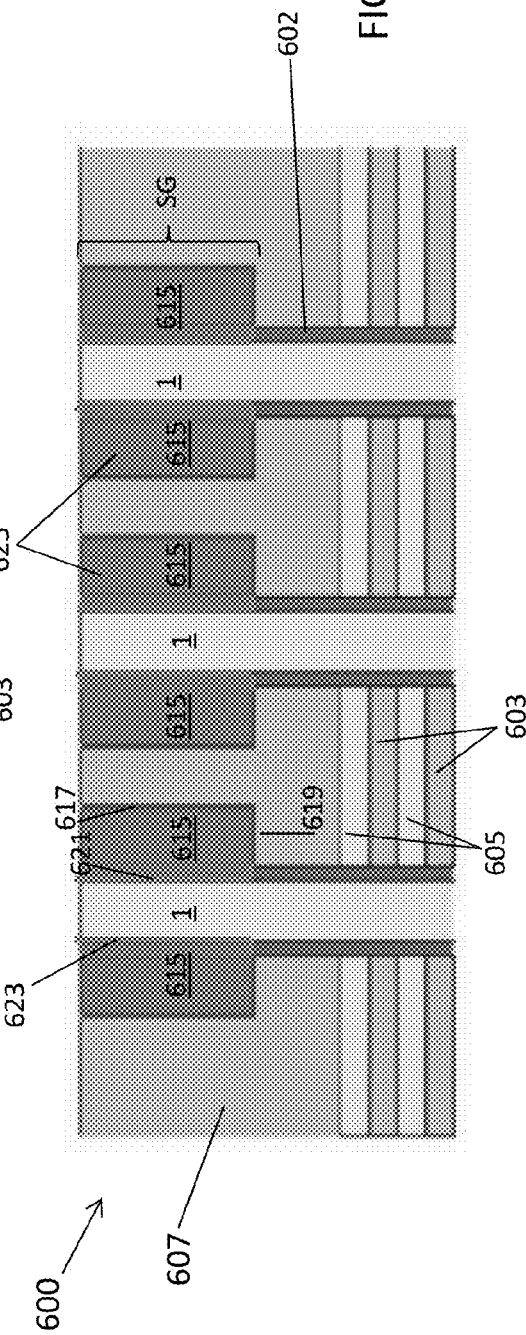

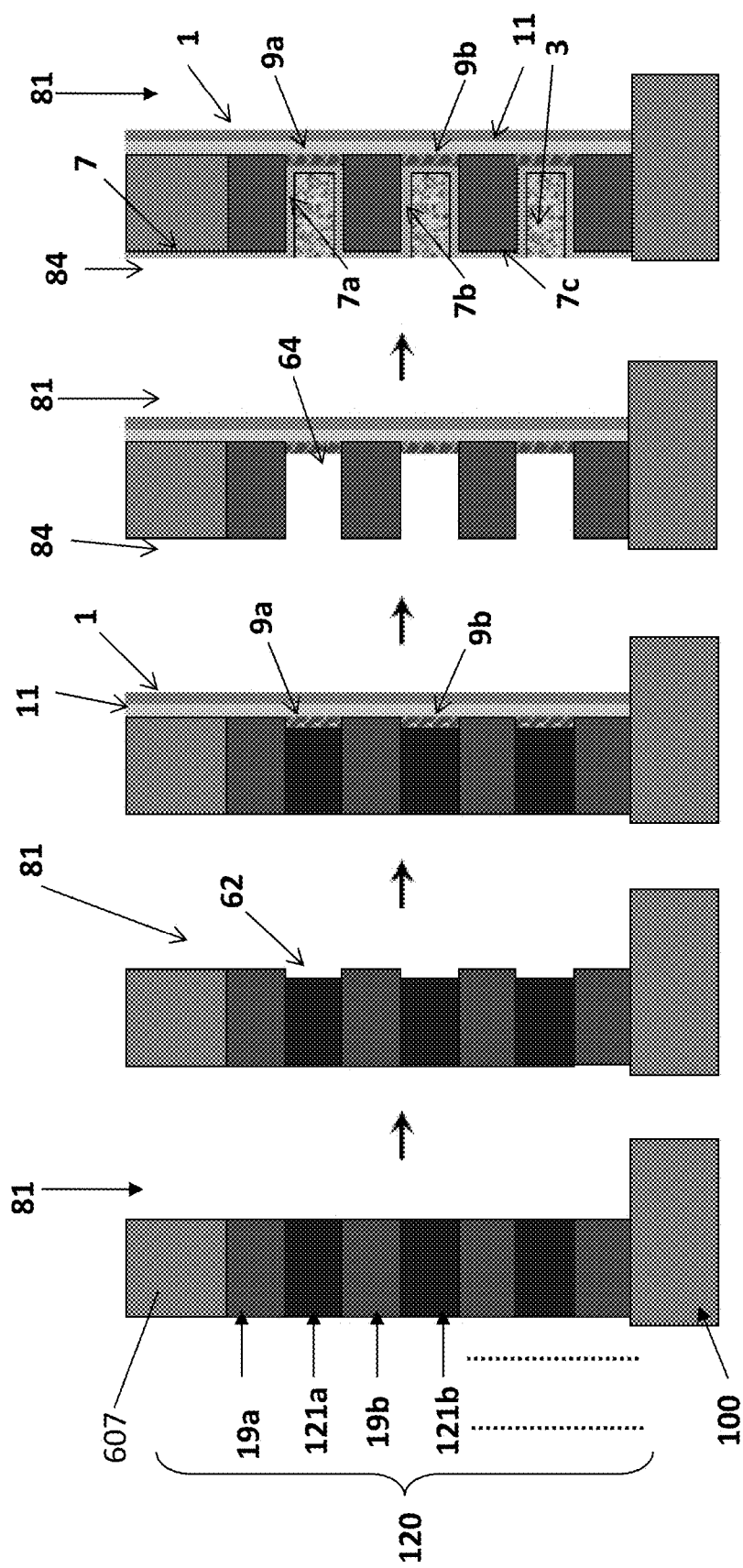

US 9,443,867 B2

METHOD OF MAKING DAMASCENE SELECT GATE IN MEMORY DEVICE

FIELD

The present disclosure relates generally to the field of semiconductor devices and specifically a method of making three dimensional vertical NAND devices and other three dimensional devices.

BACKGROUND

Three dimensional vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36. However, this NAND string provides only one bit per cell. Furthermore, the active regions of the NAND string is formed by a relatively difficult and time consuming process involving repeated formation of sidewall spacers and etching of a portion of the substrate, which results in a roughly conical active region shape.

SUMMARY

An embodiment relates to a method of fabricating a memory device that includes forming a mask over a top surface of a stack of alternating insulating material layers and control gate electrodes located over a substrate, wherein the stack has a memory opening extending through the stack in a direction substantially perpendicular to a major surface of the substrate, at least a portion of a semiconductor channel extends substantially perpendicular to the major surface of the substrate in the memory opening, at least one memory film is located in the memory opening between the semiconductor channel and the plurality of conductive control gate electrodes, and the mask covers a first portion of an upper insulating layer of the stack and exposes a second portion of the upper insulating layer adjacent to the memory opening, etching the upper insulating layer through the mask to provide a recess in the second portion of the upper insulating layer, and forming a conductive material within the recess to provide a select gate electrode adjacent to the semiconductor channel in the memory opening.

BRIEF DESCRIPTION OF THE DRAWINGS

FIGS. 1A-1B are respectively side cross sectional and top cross sectional views of a NAND string of one embodiment. FIG. 1A is a side cross sectional view of the device along line Y-Y' in FIG. 1B, while FIG. 1B is a side cross sectional view of the device along line X-X' in FIG. 1A.

FIGS. 2A-2B are respectively side cross sectional and top cross sectional views of a NAND string of another embodiment. FIG. 2A is a side cross sectional view of the device along line Y-Y' in FIG. 2B, while FIG. 2B is a side cross sectional view of the device along line X-X' in FIG. 2A.

FIGS. 6A-6F illustrate an embodiment method of making a select gate transistor for a NAND string.

FIGS. 7A-7E illustrate a method of making a NAND string.

DETAILED DESCRIPTION

The embodiments of the disclosure provide methods of fabricating a monolithic, three dimensional array of semiconductor devices, such as an array of NAND strings having at least one select gate located above a plurality of memory cells in each NAND string.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Figure 4:
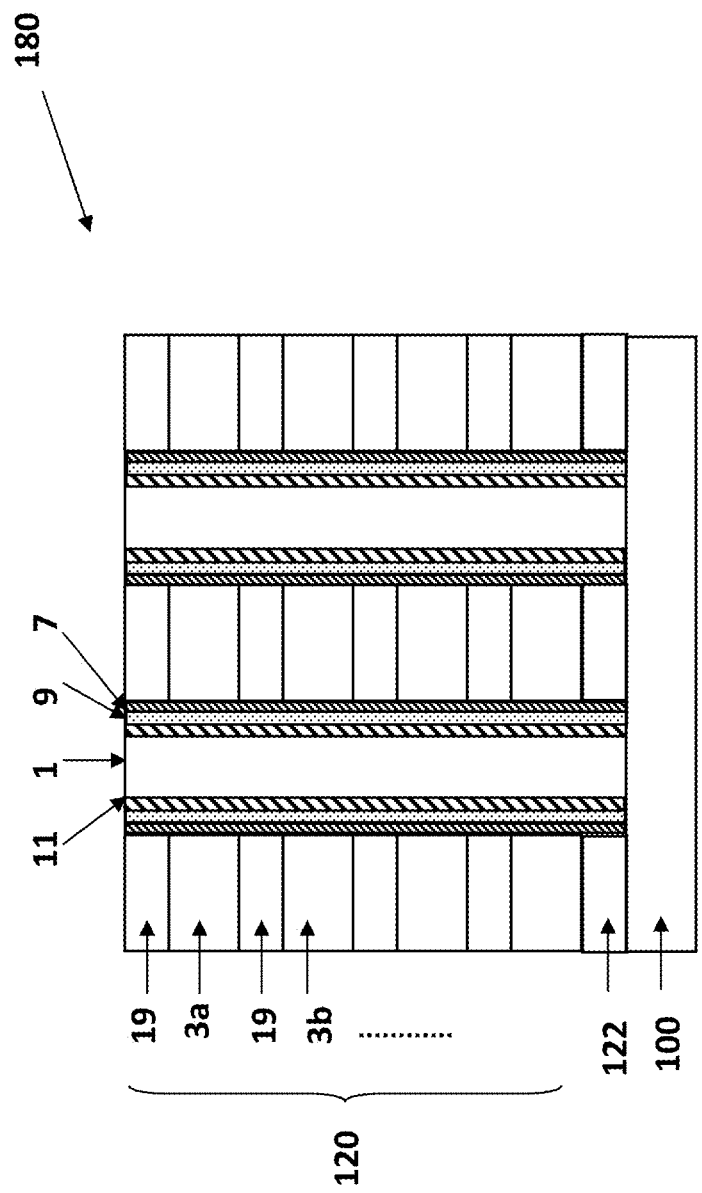
FIG. 4 is side cross sectional view of a NAND string of another embodiment.

In some embodiments, the monolithic three dimensional NAND string 180 comprises a semiconductor channel 1 having at least one end portion extending substantially perpendicular to a major surface 100a of a substrate 100, as shown in FIGS. 1A, 2A and 4. For example, the semiconductor channel 1 may have a pillar shape and the entire pillar-shaped semiconductor channel extends substantially perpendicularly to the major surface of the substrate 100, as shown in FIGS. 1A, 2A and 4. In these embodiments, the source/drain electrodes of the device can include a lower electrode 102 provided below the semiconductor channel 1 and an upper electrode 202 formed over the semiconductor channel 1, as shown in FIGS. 1A and 2A.

Figure 3:
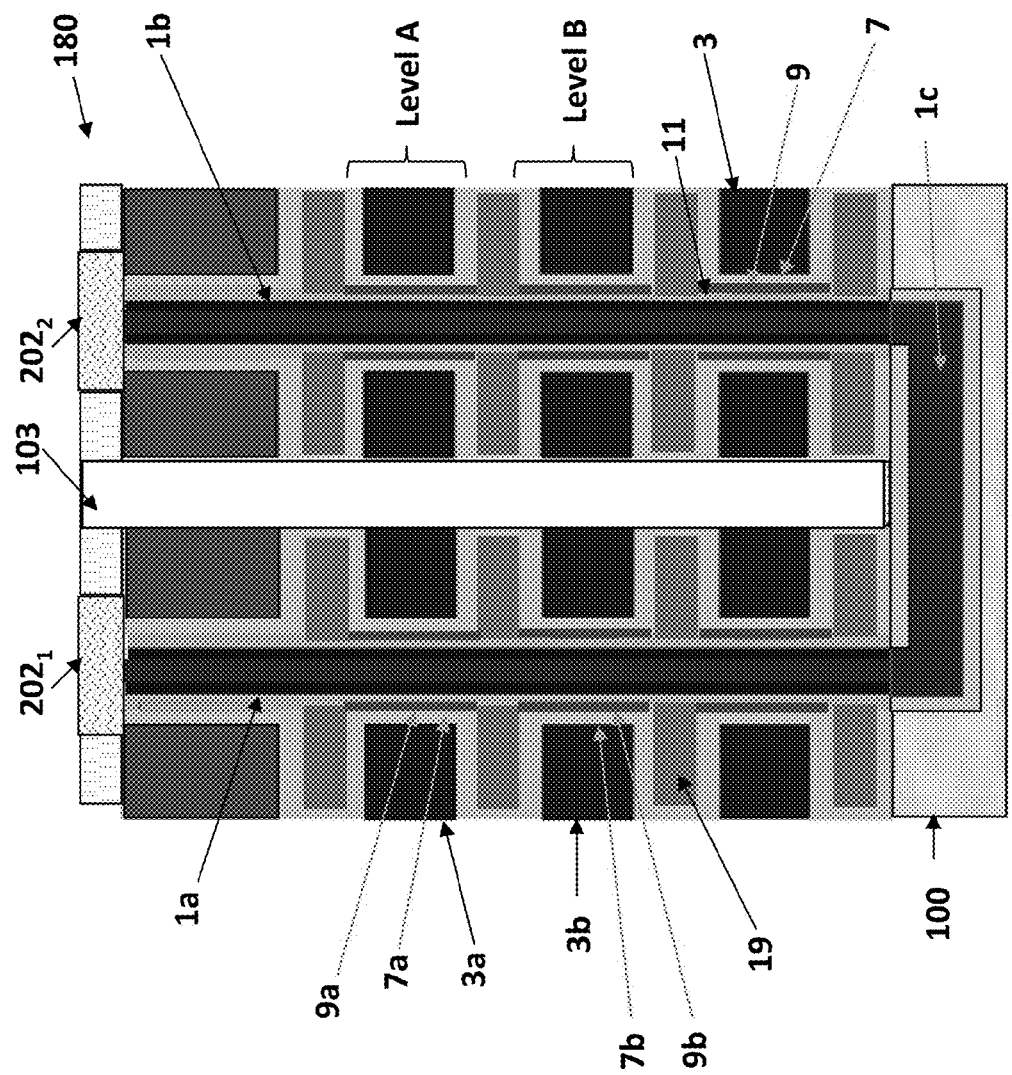
FIG. 3 is side cross sectional view of a NAND string of an embodiment with a U-shaped channel.

Alternatively, the semiconductor channel 1 may have a U-shaped pipe shape, as shown in FIG. 3. The two wing portions 1a and 1b of the U-shaped pipe shape semiconductor channel may extend substantially perpendicular to the major surface 100a of the substrate 100, and a connecting portion 1c of the U-shaped pipe shape semiconductor channel 1 connects the two wing portions 1a, 1b extends substantially parallel to the major surface 100a of the substrate 100. In these embodiments, one of the source or drain electrodes $202_1$ contacts the first wing portion of the semiconductor channel from above, and another one of a source or drain electrodes $202_2$ contacts the second wing portion of the semiconductor channel 1 from above. An optional body contact electrode (not shown) may be disposed in the substrate 100 to provide body contact to the connecting portion of the semiconductor channel 1 from below. The NAND string's select or access transistors are not shown in FIGS. 1-4 for clarity, and are described further below in connection with FIGS. 5A-B.

In some embodiments, the semiconductor channel 1 may be a filled feature, as shown in FIGS. 2A-2B, 3 and 4. In some other embodiments, the semiconductor channel 1 may be hollow, for example a hollow cylinder filled with an insulating fill material 2, as shown in FIGS. 1A-1B. In these embodiments, an insulating fill material 2 may be formed to fill the hollow part surrounded by the semiconductor channel 1. The U-shaped pipe shape semiconductor channel 1 shown in FIG. 3 and/or the channel 1 shown in FIG. 4 may alternatively be a hollow cylinder filled with an insulating fill material 2, shown in FIGS. 1A-1B.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recyrstallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three dimensional NAND string further comprise a plurality of control gate electrodes 3, as shown in FIGS. 1A-1B, 2A-2B, 3 and 4. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., device level A) and a second control gate electrode 3b located in a second device level (e.g., device level B) located over the major surface 100a of the substrate 100 and below the device level A. The control gate material may comprise any one or more suitable conductive or semiconductor control gate material known in the art, such as doped polysilicon, tungsten, tungsten nitride, copper, aluminum, tantalum, titanium, cobalt, titanium nitride or alloys thereof. For example, the control gate material in FIGS. 1A, 2A and 3 may comprise a conductive metal or metal alloy, such as tungsten and/or titanium nitride, while the control gate material in FIG. 4 may comprise doped polysilicon.

A blocking dielectric 7 is located adjacent to the control gate(s) 3 and may surround the control gate 3, as shown in FIGS. 1A, 2A and 3. Alternatively, a straight blocking dielectric layer 7 may be located only adjacent to an edge (i.e., minor surface) of each control gate 3, as shown in FIG. 4. The blocking dielectric 7 may comprise a layer having plurality of blocking dielectric segments located in contact with a respective one of the plurality of control gate electrodes 3, for example a first dielectric segment 7a located in device level A and a second dielectric segment 7b located in device level B are in contact with control electrodes 3a and 3b, respectively, as shown in FIG. 3. Alternatively, the blocking dielectric 7 may be a straight, continuous layer, as shown in FIG. 4, similar to the device described in U.S. Pat. No. 8,349,681 issued on Jan. 8, 2013 and incorporated herein by reference in its entirety.

The monolithic three dimensional NAND string also comprise a charge storage region 9. The charge storage region 9 may comprise one or more continuous layers which extend the entire length of the memory cell portion of the NAND string, as shown in FIG. 4. For example, the charge storage region 9 may comprise an insulating charge trapping material, such as a silicon nitride layer.

Alternatively, the charge storage region may comprise a plurality of discrete charge storage regions 9, as shown in FIGS. 1A, 2A and 3. The plurality of discrete charge storage regions 9 comprise at least a first discrete charge storage region 9a located in the device level A and a second discrete charge storage region 9b located in the device level B, as shown in FIG. 3. The discrete charge storage regions 9 may comprise a plurality of vertically spaced apart, conductive (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), or semiconductor (e.g., polysilicon) floating gates. Alternatively, the discrete charge storage regions 9 may comprise an insulating charge trapping material, such as silicon nitride segments.

The tunnel dielectric 11 of the monolithic three dimensional NAND string is located between charge storage region 9 and the semiconductor channel 1.

The blocking dielectric 7 and the tunnel dielectric 11 may be independently selected from any one or more same or different electrically insulating materials, such as silicon oxide, silicon nitride, silicon oxynitride, or other insulating materials. The blocking dielectric 7 and/or the tunnel dielectric 11 may include multiple layers of silicon oxide, silicon nitride and/or silicon oxynitride (e.g., ONO layers).

Figure 5A:
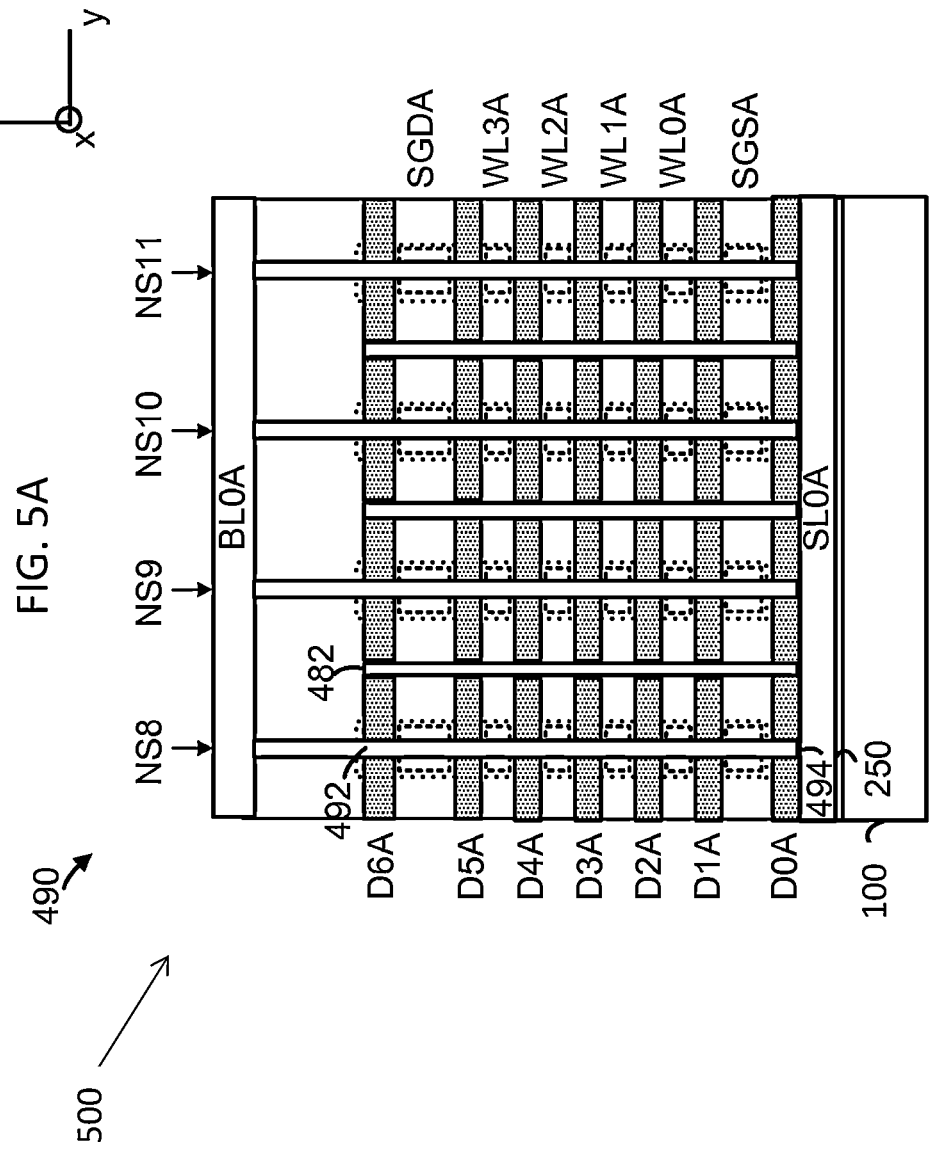
FIG. 5A is a side cross sectional view of a portion of a memory device having select gates located above and below the memory levels in a straight NAND string.

FIG. 5A depicts a cross-section view of a portion of a memory device 500, which is similar to the device described in U.S. Provisional Application Ser. No. 61/879,074 filed on Sep. 17, 2013 and incorporated herein by reference in its entirety. Columns of memory cells corresponding to NAND strings NS8 to NS11 are depicted in the multi-layer stack 490. Each NAND string NS8 to NS11 is indicated by dotted dashed lines. The NAND strings NS8 to NS11 may have a source end 494 at a bottom of the stack (i.e., proximate to the substrate 100) and a drain end 492 at the top of the stack (i.e., distal to the substrate 100). The NAND strings NS8 to NS11 may be similar to the NAND strings shown in 1A, 2A and 4. Additional NAND strings may extend in front and back of the NAND strings shown in FIG. 5A (i.e., along the x-axis, or into and out of the page). Slit trenches 482, which may be filled with a dielectric material, may extend through the stack 490 to provide electrical isolation between individual or groups of NAND strings. The stack 490 may include a substrate 100, an optional insulating film 250 on the substrate, and a source line SL0A that may be electrically connected to the source end 494 of the plurality of NAND strings. A bit line BL0A may electrically connect to the drain end 494 of the plurality of NAND strings.

The stack 490 may include alternating insulating (e.g., dielectric) and conductive layers. The insulating layers include D0A to D6A and may be made of $SiO_2$, for instance. The conductive layers include word line layers, WL0A to WL3A, e.g., conductive paths to control gates of the memory cells, and select gate layers, SGSA and SGDA, e.g., conductive paths to select gates of select gate transistors of the NAND strings. In the embodiment of FIG. 5A, layer SGDA couples to the select gate of a drain-side select gate transistor located above the memory cells of the NAND string (i.e., proximate to the drain end 492 of the NAND string), and layer SGSA couples to the select gate of a source-side select gate transistor located below the memory cells of the NAND string (i.e., proximate to the source end 494 of the NAND string). The conductive layers WL0A to WL3A, SGDA and SGSA may be formed of any suitable electrically conductive material, such as a metal or metal nitride, doped polysilicon, metal silicide, etc., and may be formed of the same of different materials. The dashed lines in FIG. 5A depict memory cells and select gate transistors. Alternatively, the source line(s) may extend through the dielectric filled trenches 482 to a horizontal portion of the semiconductor channel located in or over the substrate 100, as described in U.S. patent application Ser. No. 14/133,979 filed on Dec. 19, 2013 and incorporated herein by reference in its entirety.

Figure 5B:
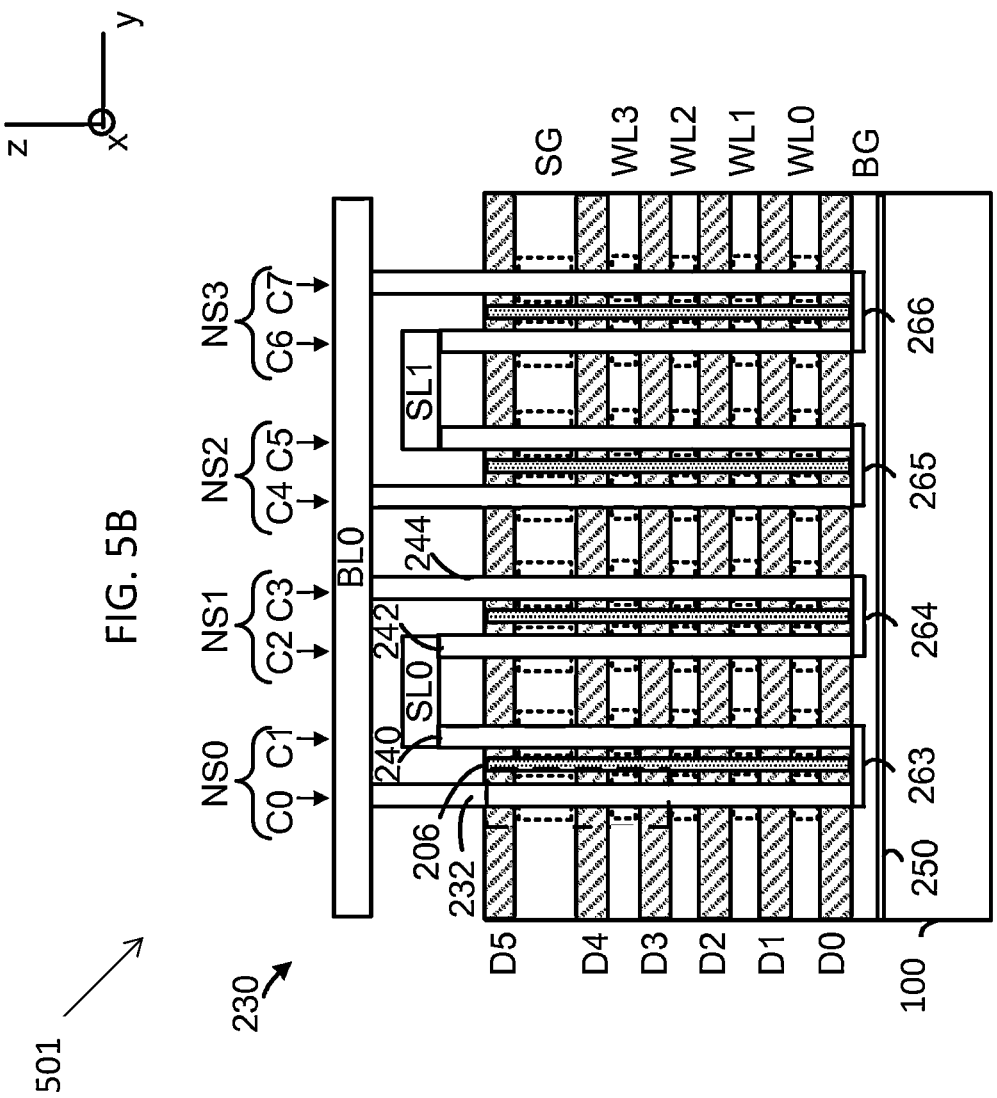
FIG. 5B is a side cross sectional view of a portion of a memory device having a U-shaped channel and select gates located above the memory levels.

FIG. 5B depicts a cross-section view of a portion of a memory device 501 according to another embodiment. Columns of memory cells C0 to C7 are depicted in the multi layer stack 230. Each NAND string NS0 to NS3 is a U-shaped NAND string that includes pairs of adjacent columns of memory cells (e.g., NAND string NS0 comprises columns C0 and C1) connected by a connecting portion 263, 264, 265 and 266. The NAND strings NS0 to NS3 in FIG. 5B may be similar to the NAND string shown in FIG. 3. The stack 230 may include a substrate 100, an optional insulating layer 250 over the substrate 100 and a back gate layer BG, which is a conductive layer, over the insulating layer 250 and in electrical contact with the connecting portions 263 to 266 of the NAND strings. Each U-shaped NAND string NS0 to NS3 may have a drain end 232, 244 at the top of the stack above the memory cells of a first (i.e., drain-side) column of the NAND string (i.e., C0, C3, C4, C7) and a source end 240, 242 at the top of the stack above the memory cells of a second (i.e., source side) column of the NAND string (i.e., C1, C2, C5, C6). Additional NAND strings may extend in front and back of the NAND strings shown in FIG. 5B (i.e., along the x-axis, or into and out of the page). Slit trenches 206, which may be filled with a dielectric material, may extend through the stack 230 between the drain- and source-side columns of the NAND strings NS0 to NS3. The drain-side columns C0, C3, C4, C7 of each NAND string may be electrically connected to a bit line BL0 and the source-side columns C1, C2, C5, C6 of the NAND strings may be electrically connected to one or more source line(s) SL0, SL1.

The stack 230 may include alternating insulating (e.g., dielectric) and conductive layers. The insulating layers include D0 to D5 and may be made of $SiO_2$, for instance. The conductive layers include word line layers, WL0 to WL3, e.g., conductive paths to control gates of the memory cells, and a select gate layer SG. In the embodiment of FIG. 5B, the select gate layer SG may form conductive paths to control gates of both the source-side and the drain-side select gate transistors of the NAND strings, which are both located at the top of the stack above the memory cells. The conductive layers WL0 to WL3 and SG may be formed of any suitable electrically conductive material, such as a metal or metal nitride, doped polysilicon, metal silicide, etc., and may be formed of the same or different materials. The dashed lines in FIG. 5B depict memory cells and select gate transistors.

As can be seen from FIGS. 5A and 5B, in both of these embodiments, a conductive select gate electrode layer (SGDA in FIG. 5A and SG in FIG. 5B) is located over the memory levels (i.e., memory cells) in the NAND string. In the prior art fabrication method, the select gate electrode layer SGDA, SG is formed as part of the multi-layer stack 490, 230 followed by etching through the stack 490, 230, including through the conductive select gate electrode layer SGDA, SG, to form a plurality of memory openings extending substantially perpendicular to the major surface of the substrate 100. At least one memory film, such as a film containing a blocking dielectric layer 7, a charge storage layer 9, and a tunnel dielectric layer 11, may be formed over the sidewalls of the memory openings, and the semiconductor channels 1 may be formed in the memory openings such that the at least one memory film is located between the semiconductor channel 1 and at least a portion of the sidewall of each memory opening (e.g., as shown in FIGS. 1A-4). The stack 490, 230, including the conductive select gate electrode layer SGDA, SG, may also be etched to form one or more isolation trenches, such as trenches 482 and 206 shown in FIGS. 5A-B. However, dimensional control of the various features of the memory device is difficult using this process. For example, it is difficult to satisfy the dual requirements of depth and spacing using this process.

Various embodiments provide an improved method for forming a select gate in a monolithic, three-dimensional memory device using a damascene process. A damascene process may be used to form a conductive material, such as a metal interconnect, by defining a recess or trench pattern in a layer of dielectric material, depositing a conductive material to fill the recesses or trenches, and removing the excess conductive material by planarization to leave the conductive material in the desired pattern. In embodiments, a vertical NAND string including a semiconductor channel and at least one memory film is formed through a multi-layer stack, where the stack includes a top layer of insulating material. The top layer of insulating material may be etched to form a recess adjacent to the semiconductor channel of the NAND string. A gate insulating layer and a conductive material may be deposited over the top layer of insulating material and within the recess, followed by planarization of the conductive material to leave a select gate electrode and gate insulating layer located adjacent to the semiconductor channel of the NAND string. The various embodiments may facilitate dimensional control in a monolithic, three-dimensional NAND-string memory device.

FIGS. 6A-6F illustrate a method for forming a select gate transistor in a monolithic, three-dimensional memory device. FIGS. 6A-6F illustrate an upper portion of a stack 600 of alternating layers of a first material 603 and a second material 605 different than the first material over a major surface of a substrate (the substrate is not visible in the view of FIGS. 6A-6F). The stack 600 may be similar to the stacks 490, 230 shown in FIGS. 5A-B, and may include alternating insulating (e.g., dielectric) layers and conductive layers. The insulating layers 603 may be made of an oxide, such as $SiO_2$. Layers 605 may comprise word line layers of a conductive material that form conductive paths to control gates of memory cells at the respective memory levels (e.g., Level A, Level B, etc.). Alternatively, layers 605 may comprise a sacrificial material, such as polysilicon or silicon nitride, that may be later removed and replaced with a conductive word line material, as is described below in connection with FIGS. 7A-7E.

Figure 6A:
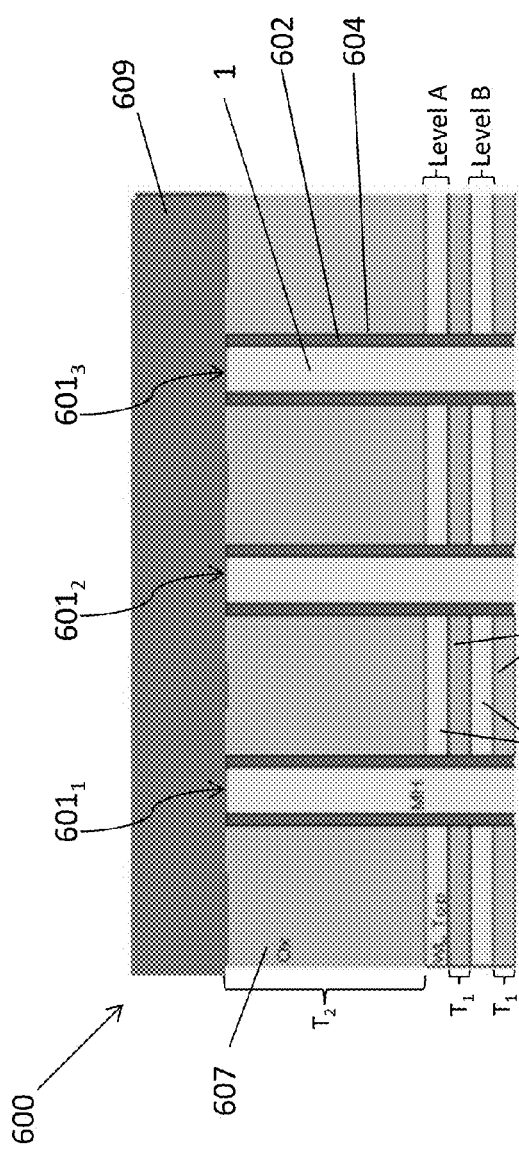

The stack 600 of FIG. 6A may be different from the multi-layer stacks 490, 230 shown in FIG. 5A-B in that stack 600 may lack a conductive material layer for a select gate electrode above the memory levels, such as layers SGDA and SG shown in FIGS. 5A and 5B, respectively. The stack 600 of FIG. 6 may include a relatively thick insulating (e.g., dielectric) layer 607 at the top of the stack 600 above the uppermost memory level (i.e., Level A). Layer 607 may be made of an oxide material, such as silicon oxide, and may be made of the same or a different material as insulating layers 603. Each of the layers 603 of insulating material between the memory levels may have a first thickness, $T_1$, in a direction perpendicular to the major surface of the substrate and the top layer 607 of insulating material may have a second thickness, $T_2$, in a direction perpendicular to the major surface of the substrate that is greater than the first thickness, $T_1$ (e.g., $T_2$ may be at least about twice as great as $T_1$, such as 2-20 times greater than $T_1$).

The stack 600 includes a plurality of memory openings $601_1$, $601_2$, $601_3$ extending through the stack 600 in a direction that is substantially perpendicular to the major surface of the substrate. Each memory opening $601_1$, $601_2$, $601_3$ includes a semiconductor channel 1 extending within the memory opening substantially perpendicular to the major surface of the substrate. The semiconductor channel 1 may comprise polysilicon, for example. Each memory opening $601_1$, $601_2$, $601_3$ also includes at least one memory film 602 that extends over a sidewall 604 of the memory opening. The at least one memory film 602 may include a blocking dielectric layer 7, a charge storage layer 9, and/or a tunnel dielectric layer 11, such as described above in connection with FIGS. 1A-4. The at least one memory film 602 may be located between the semiconductor channel 1 and a sidewall 604 of the memory opening 601, as shown in FIG. 6A. The semiconductor channel 1 may be a pillar-shaped channel that extends in one memory opening, such as in FIGS. 1A-2B, 4 and 5A, or may be a U-shaped pipe shape semiconductor channel 1 that extends in multiple memory openings, such as in FIGS. 3 and 5B.

In embodiments, the memory openings $601_1$, $601_2$, $601_3$ may be formed by etching the stack 600, including the alternating layers 603, 605 and the top insulating layer 607 through a mask (not shown) to define the memory openings $601_1$, $601_2$, $601_3$. The at least one memory film 602 may then be formed over the sidewalls 604 of the memory openings $601_1$, $601_2$, $601_3$, and the semiconductor channel 1 may be formed over the at least one memory film 602 within each of the memory openings $601_1$, $601_2$, $601_3$. In embodiments, the semiconductor channel 1 may fill the memory openings $601_1$, $601_2$, $601_3$ as shown in FIG. 6A. In some other embodiments, the semiconductor channel 1 may be hollow, for example a hollow cylinder, and may be filled with an insulating fill material, such as fill material 2 shown in FIGS. 1A-1B.

Figure 6B:
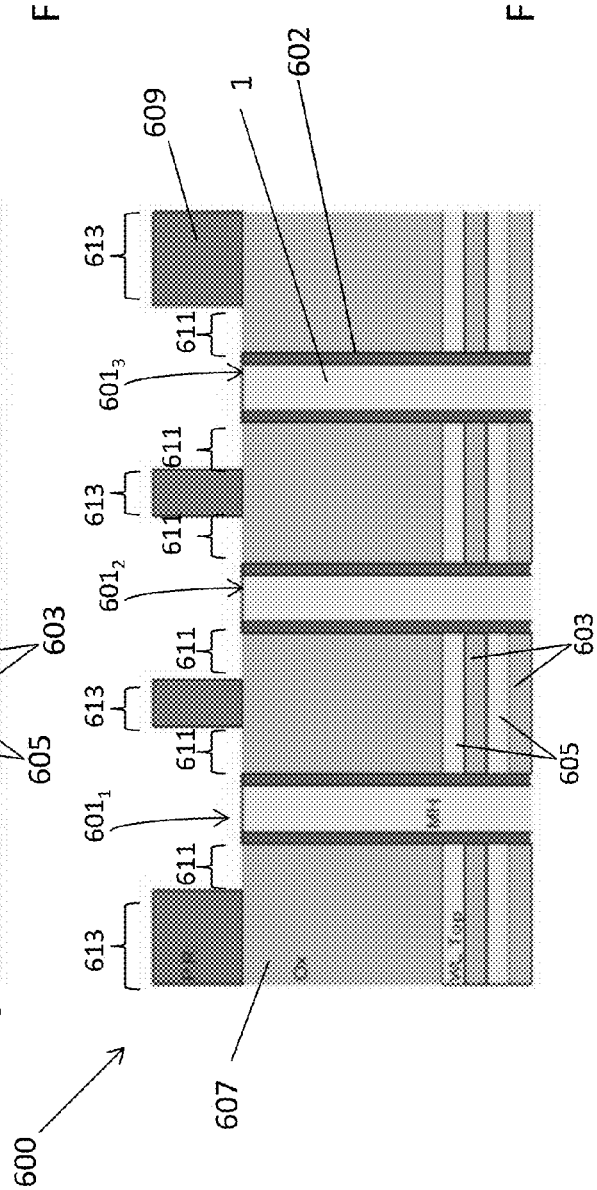

As shown in FIG. 6A, a mask layer 609 may be formed over the stack 600, including over the upper insulating layer 607 and the top surfaces of the memory openings $601_1$, $601_2$, $601_3$. The mask layer 609 may comprise a photoresist material. The mask layer 609 may be patterned using photolighography and portions of the layer 609 may be removed to expose the top surfaces of the memory openings $601_1$, $601_2$, $601_3$ and portions 611 of the top insulating layer 607 located adjacent to the memory openings $601_1$, $601_2$, $601_3$, as shown in FIG. 6B. Other portions 613 of the top insulating layer 607 that are not located adjacent to the memory openings $601_1$, $601_2$, $601_3$ may remain covered by the mask layer 609.

The stack 600 may be selectively etched through the mask layer 609 to form recesses 615 within the top insulating layer 607 and the mask layer 609 may be removed as shown in FIG. 6C. The stack 600 may be etched using an etching process that selectively etches the material of the top insulating layer 607 (e.g., $SiO_2$) and of the memory film 602 while leaving the semiconductor channel 1 intact, such that the upper portions of the channels 1 form protruding (e.g., cylindrical) pillars in the respective recesses. The stack 600 may be etched using a reactive ion etching (REI) process, for example. As shown in FIG. 6C, the recesses 615 are formed adjacent to each of the semiconductor channels 1 and may concentrically surround the semiconductor channels 1. The top insulating layer 607 may form a first sidewall 617 and at least a portion of a bottom surface 619 of each recess 615. The semiconductor channels 1 may form a second sidewall 621 of each recess 615.

In FIG. 6D, an insulating layer 623 may be formed over the stack 600, including over the top surface of the insulating layer 607, over the sidewalls 617, 621 and bottom surfaces 619 of the recesses 615, and over the top surfaces of the semiconductor channels 1. In one embodiment, the insulating layer 623 may be a silicon oxide layer and may be formed by a suitable process (e.g., CVD) using a tetraethyl orthosilicate (TEOS) source.

In FIG. 6E, a layer of an electrically conductive material 625 may be deposited over the insulating layer 623 and may completely fill the recesses 615. The electrically conductive material 625 may be, for example, a heavily doped semiconductor material, a metal and/or a metal nitride. Exemplary conductive materials include, for instance, doped polysilicon, tungsten, tungsten nitride, tantalum, titanium and titanium nitride.

The layer of electrically conductive material 625 may extend above the recesses 615 and may cover the top surface of the insulating layer 607 and the semiconductor channels 1 as shown in FIG. 6E. In FIG. 6F, the stack 600 is planarized to remove the excess conductive material 625 from above the recesses 615. In addition, the planarization may remove the insulating layer 623 from the top surfaces of insulating layer 607 and the semiconductor channels 1. The stack 600 may be planarized using any suitable process, such as an etch-back process and/or chemical-mechanical polishing (CMP). As shown in FIG. 6F, the planarization forms discrete regions of the conductive material 625 located within the recesses 615 of the insulating layer 607 and adjacent to the semiconductor channels 1 and separated from one another by the top insulating layer 607. The insulating layer 623 extends adjacent to the conductive material 625 over the first and second sidewalls 617, 621 and bottom surface 619 of each of the recesses 615. The insulating layer 623 extends between the conductive material 625 and the semiconductor channel 1 and acts as a gate insulating layer for a source-side or drain-side select gate transistor SG for a NAND string formed in the stack 600. The conductive material 625 may provide a select gate electrode for the select gate transistor SG. The stack 600 may be further processed to provide a monolithic, three-dimensional memory device, such as shown in FIGS. 5A-5B.

FIGS. 7A-7E illustrate an embodiment method for forming a NAND memory string in a multi-layer stack. As discussed above, in preferred embodiments, the NAND memory string may be formed in the stack prior to the formation of a select gate above the memory levels of the NAND string as shown in FIG. 6A-6F. It will be understood that FIGS. 7A-7E illustrate one exemplary method for forming a NAND memory string, and that other methods of forming a NAND string may also be utilized.

A portion of the stack 120 containing insulating first layers 19 (e.g., 19a, 19b, etc.) and sacrificial second layers 121 (e.g., 121a, 121b, etc.) is shown in FIG. 7A. The stack 120 may also include a relatively thick layer of insulating material 607 at the top of the stack 120 that may be later used to form a select gate transistor for the NAND string, as shown in FIGS. 6A-6F. The stack 120 is etched to form one or more memory openings 81 (i.e., front side openings) as described above.

Next, in an optional step as shown in FIG. 7B, the second material 121 is selectively etched compared to the first material 19 to form front side recesses 62 in the second material 121 (i.e., layers 121a, 121b, etc). The recesses 62 may be formed by selective, isotropic wet or dry etching which selectively etches the second material 121 compared to the first material 19. The depth of each recess 62 may be 3 to 20 nm. This step may be omitted if desired.

As shown in FIG. 7C, a plurality of discrete semiconductor, metal or silicide charge storage regions 9 are selectively formed on portions of the second material layers 121 exposed in the front side opening 81. The charge storage regions 9 comprise a plurality of charge storage segments or regions (e.g., 9a and 9b) located on the exposed edges of the second material 121 in the front side recesses 62.

In one embodiment, the charge storage regions 9 are selectively formed by selective growth of the regions on the exposed edges of the semiconductor second material layers 121 but not on the exposed insulating first material layers 19. Any suitable selective growth methods may be used to form the charge storage regions 9, such as chemical vapor deposition.

In one aspect of the selective growth embodiment, charge storage regions 9 comprise doped polysilicon regions which are selectively grown by CVD on the portions of the undoped or intrinsic second material layers 121 (e.g., undoped or intrinsic semiconductor having a polycrystalline or amorphous structure, such as polysilicon, amorphous silicon, silicon germanium or germanium) exposed in the front side opening 81. For example, the doped polysilicon regions 9 may comprise boron doped, p-type polysilicon regions (e.g., lightly or heavily doped) which are selectively, epitaxially grown on polysilicon layer 121 edges exposed in the front side openings 81. The doped polysilicon regions 9 are not grown on portions of the first material layers 19 (e.g., silicon oxide) exposed in the front side opening 81.

Any suitable silicon selective epitaxial growth (SEG) conditions may be used to form regions 9. For example, a chemical vapor deposition (CVD) SEG process which combines a silicon source gas and a silicon growth inhibitor gas which inhibits silicon growth on the oxide layers 19 may be used. Exemplary silicon source gases include silane and chloro-silanes (e.g., $SiH_4$, $SiH_2Cl_2$, and/or $SiHCl_3$). Exemplary inhibitor gases which inhibit silicon growth on $SiO_2$ include HCl and/or $Cl_2$. $H_2$ may be used as a carrier gas while $B_2H_6$, $AsH_3$ and/or $PH_3$ gases may be added to introduce dopants to the silicon regions 9. Any suitable SEG temperatures and pressures may be used, such as a temperature of 500 to 800 C and a pressure of 10 mTorr to 100 Torr (i.e., LPCVD). Similar process conditions may be used to form germanium or silicon-germanium charge storage regions 9, where germane ($GeH_4$) is substituted for silane or provided in addition to silane, at lower temperatures (e.g., 340 to 380C) and pressure of about 10 mTorr-5 Torr, such as about 1 Torr.

In another aspect of the selective growth embodiment, charge storage regions 9 comprise selectively grown metal or silicide charge storage regions, such as on the portions of the second material layers exposed in the front side opening. Any metal (i.e., pure metal or conductive metal alloy) or metal silicide which may be selectively grown on exposed semiconductor layer 121 in the opening 81 may be used. For example, the charge storage regions 9 may comprise selectively grown tungsten, molybdenum or tantalum regions that are selectively grown on the semiconductor material (e.g., silicon) 121 but not on insulating material (e.g., silicon oxide) 19 from a metal halide source gas (e.g., tungsten hexafluoride) in a CVD process.

Selective deposition of refractory metals, such as W, Mo or Ta, on silicon may be performed by metal halide source gas reduction by $SiH_4$, where a ratio of $SiH_4$ to metal halide is less than one. For example, as disclosed in U.S. Pat. Nos. 5,084,417 and 5,807,788, incorporated herein by reference in their entirety, in the selective CVD process, the metal halide source gas may comprise $WF_6$, $MoF_6$ or $TaCl_5$ and the deposition temperature and pressure may range from 370 to 550 C and 100 to 500 mTorr, respectively. The ratio of the $SiH_4$/metal halide flow rates may range between 0.4 and 0.6.

If the front side recesses 62 are present, then the regions 9 may be selectively grown in the front side recesses 62 until their edges are about even with the edges of the insulating material 19 such that they form a relatively straight sidewall of the front side opening 81 (e.g., as much as a timed selective growth permits). Alternatively, the selective growth of regions 9 is terminated before regions 9 completely fill the recesses 62. Thus, regions 9 may partially fill recesses 62 and may remain horizontally recessed in the opening 81 compared to insulating material layers 19. Alternatively, the selective growth of regions 9 is terminated after regions 9 completely fill the recesses 62 such that the regions 9 protrude horizontally into the front side opening 81 past layers 19, as shown in FIG. 7C.

In another embodiment, the regions 9 are selectively formed by doping of the semiconductor layers 121 exposed in the front side opening 81. For example, when layers 121 comprise intrinsic or undoped semiconductor layers, a timed gas phase diffusion doping may be carried out to dope the edge portions 9 of layers 121 facing the opening 81 by providing a doping gas through the opening 81. The doping is terminated before the entire volume of layers 121 are doped, such that portions of layers 121 located behind regions 9 and facing away from the opening 81 remain undoped. For example, for Group IV semiconductor material (e.g., silicon) layers 121, the doping gas may comprise a boron containing gas, such as diborane, to form p-type doped regions 9, or a phosphorus or arsenic containing gas, such as phosphine or arsene, to form n-type doped regions 9.

In the next step shown in FIG. 7C, a tunnel dielectric layer 11 is deposited over the charge storage regions 9a, 9b and the insulating first material layers 19 between the charge storage regions in the front side opening 81. Then, the channel 1 is formed by depositing channel material 1, such as a lightly doped or intrinsic polysilicon over the tunnel dielectric layer 11 in the front side opening 81. If desired, a high temperature anneal may be performed after forming the channel.

As discussed above, the entire opening 81 may be filled to form the device illustrated in FIGS. 2A and 2B. Alternatively, a layer of channel material may first be deposited in the opening 81 followed by deposition of an insulating fill material 2 to form the device illustrated in FIGS. 1A and 1B. If desired, the channel 1 may be U-shaped as illustrated in FIG. 3.

The channel 1 may be formed by filling the front side opening 81 with a lightly doped semiconductor material (e.g., polysilicon) and then etched back from the top to form the pillar shaped (or U-shaped) channel 1 in the opening 81. In the embodiment of FIG. 3, the space between the wings of the U-channel 1 is filled with a gap fill insulating layer 103, such as silicon oxide or another material. Layer 103 may be formed by etching the stack 120 to form a rail shaped cut, followed by depositing an oxide layer followed by etch back or chemical mechanical polishing to form a planar top surface exposing the top surfaces of the channels 1.

In the next step shown in FIG. 7D, the stack 120 is patterned to form one or more back side openings 84 in the stack. The back side opening(s) 84 may be formed by photolithography and anisotropic etching of the stack. Preferably, the opening(s) 84 have a slit trench shape. The back side opening(s) 84 may be formed either before or after the formation of the select gate electrode as shown in FIGS. 6A-6F.

Then, at least a portion of the second material layers 121 are removed through the back side opening 84 to form back side recesses 64 between the first material layers 19. For example, layers 121 may be removed completely by selective wet etching using a liquid etching medium which selectively etches the material of layers 121 compared to the materials of layers 19 and regions 9. For example, if layers 121 comprise undoped or intrinsic polysilicon, layers 19 comprise silicon oxide and regions 9 comprise doped polysilicon, silicide or metal, then an undoped polysilicon selective etch may be used which stops on doped polysilicon (e.g., p-type polysilicon) regions 9 which act as an etch stop. Alternatively, the selective etch may be a timed etch which is timed to remove only a portion of the sacrificial second material layers 121 through the back side opening 84. In this case, a remaining portion of the second material layers 121 rather than regions 9 remain exposed in the back side recesses 64.

Then, as shown in FIG. 7E, the blocking dielectric layer 7 (also known as an inter-poly dielectric, IPD) is then formed in the back side recesses 64 through the back side opening 84 such that the blocking dielectric coats the sides of the back side recesses 64 and the back side of layers 19 exposed in the back side opening 84. The blocking dielectric layer 7 may comprise a silicon oxide layer deposited by conformal atomic layer deposition (ALD) or chemical vapor deposition (CVD). Other high-k dielectric materials, such as hafnium oxide, aluminum oxide, or multi-layer dielectrics (e.g., ONO) may be used instead or in addition to silicon oxide. Optionally, an insulating capping layer (e.g., silicon nitride) may be deposited into the openings before the blocking dielectric 7 and may comprise a back portion of a multi-layer blocking dielectric. The blocking dielectric 7 may have a thickness of 6 to 20 nm. An optional anneal, such as a rapid thermal anneal, may be conducted after the blocking dielectric formation.

The blocking dielectric layer 7 comprises a plurality of clam-shaped blocking dielectric segments 7a, 7b in the back side recesses 64 connected to each other by vertical portions 7c of the blocking dielectric layer 7 located on the exposed edges of the first material layers 19 in the back side opening 84. As used herein a "clam" shape is a side cross sectional shape configured similar to an English letter "C". A clam shape has two segments which extend substantially parallel to each other and to the major surface 100a of the substrate 100. The two segments are connected to each other by a third segment which extends substantially perpendicular to the first two segments and the surface 100a. Each of the three segments may have a straight shape (e.g., a rectangle side cross sectional shape) or a somewhat curved shape (e.g., rising and falling with the curvature of the underlying topography). The term substantially parallel includes exactly parallel segments as well as segments which deviate by 20 degrees or less from the exact parallel configuration. The term substantially perpendicular includes exactly perpendicular segments as well as segments which deviate by 20 degrees or less from the exact perpendicular configuration. The clam shape preferably contains an opening bounded by the three segments and having a fourth side open.

The opening in the clam shaped blocking dielectric segments is then filled by a control gate 3 material. As described above, the control gate material may comprise a thin barrier layer/adhesion layer such as titanium nitride or tungsten nitride and metal, such as tungsten or a combination of tungsten and titanium nitride layers. The control gate material may be deposited by CVD and fills the remaining volume of the back side recesses 64 inside the clam shaped blocking dielectric 7 segments and the entire back side opening 84. The deposition of the control gate material is followed by etching the control gate material to remove it from the back side opening 84 using anisotropic etching, while leaving the control gate material inside the back side recesses 64 in the clam shaped blocking dielectric 7 segments. The remaining control gate material inside the back side recesses 64 forms the control gates 3 of the vertical NAND string.

The channels 1 are then connected to source and drain electrodes 102, 202 as shown in FIGS. 1-3. At least one select gate electrode may be formed in the upper insulating layer 607 as shown in FIGS. 6A-6F and may be connected to select gate contacts. Control gate electrodes 3 (e.g., the end portions of the word lines) may be connected to word line contacts as known in the art.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. All of the publications, patent applications and patents cited herein are incorporated herein by reference in their entirety.

What is claimed is:

1. A method of fabricating a memory device, comprising:
   forming a mask over a top surface of a stack of alternating insulating material layers and control gate electrodes located over a substrate;
   wherein:
     the stack has a memory opening extending through the stack in a direction substantially perpendicular to a major surface of the substrate;
     at least a portion of a semiconductor channel extends substantially perpendicular to the major surface of the substrate in the memory opening;
     at least one memory film is located in the memory opening between the semiconductor channel and the plurality of conductive control gate electrodes; and
     the mask covers a first portion of an upper insulating layer of the stack and exposes a second portion of the upper insulating layer adjacent to the memory opening;
   etching the upper insulating layer through the mask to provide a recess in the second portion of the upper insulating layer; and
   forming a conductive material within the recess to provide a select gate electrode adjacent to the semiconductor channel in the memory opening.

2. The method of claim 1, wherein the recess concentrically surrounds the semiconductor channel in the memory opening.

3. The method of claim 1, wherein forming the conductive material within the recess comprises:

forming a layer of the conductive material within the recess and over the top surface of the stack; and planarizing the conductive material to expose the first portion of the top insulating layer, a top surface of the memory opening and the conductive material within the recess adjacent to the memory opening.

4. The method of claim 3, wherein the conductive material is planarized by at least one of an etch-back process and chemical-mechanical polishing.

5. The method of claim 3, further comprising removing the mask prior to forming the conductive material.

6. The method of claim 5, further comprising:
removing the at least one memory film from the recess; and
forming a layer of gate insulating material over the first portion of the upper insulating layer, an upper surface of the memory opening, and a bottom surface and a sidewall of the recess adjacent to the semiconductor channel.

7. The method of claim 6, wherein the layer of gate insulating material comprises a silicon oxide layer made from a tetraethyl orthosilicate (TEOS) source.

8. The method of claim 6, wherein:
the conductive material is formed in the recess over the layer of gate insulating material to form a select gate transistor; and
planarizing the conductive material further comprises removing the layer of gate insulating material from the first portion of the upper insulating layer and the top surface of the memory opening.

9. The method of claim 1, wherein forming the mask comprises:
forming a layer of photoresist material over the top surface of the stack; and
patterning the layer of photoresist material to remove the photoresist from the second portion of the upper insulating layer adjacent to the memory opening.

10. The method of claim 1, further comprising forming the stack of alternating insulating material layers and control gate electrodes over the substrate.

11. The method of claim 1, further comprising:
forming a plurality of alternating sacrificial layers and the insulating material layers over the substrate;
forming a back side opening through the plurality of alternating sacrificial layers and the insulating material layers;
removing the sacrificial material layers through the back side opening to form a plurality of control gate recesses; and
forming the conductive control gate electrodes in the plurality of control gate recesses through the back side opening.

12. The method of claim 1, wherein:
the stack comprises a first plurality of insulating material layers, each of which is located between each pair of the plurality of control gate electrodes;
each of the first plurality of insulating material layers have a first thickness in a direction perpendicular to the major surface of the substrate;
the upper insulating layer is located over the first plurality of insulating material layers and the plurality of control gate electrodes; and
the upper insulating layer has a second thickness in a direction perpendicular to the major surface of the substrate that is greater than the first thickness.

13. The method of claim 12, further comprising:
forming the memory opening by etching the stack through a mask;
forming the at least one memory film over at least a portion of a sidewall of the memory opening; and
forming the semiconductor channel in the memory opening such that the at least one memory film is located between the semiconductor channel and the at least a portion of the sidewall of the memory opening.

14. The method of claim 1, wherein the semiconductor channel comprises polysilicon.

15. The method of claim 1, wherein:
the at least one memory film comprises a blocking dielectric, a charge trapping layer or floating gate and a tunnel dielectric;
the tunnel dielectric is located between the charge trapping layer or floating gate and the semiconductor channel; and
the blocking dielectric is located between the charge trapping layer or floating gate and the plurality of control gate electrodes.

16. The method of claim 1, wherein the memory opening further comprises an insulating material in a core of the memory opening such that the semiconductor channel concentrically surrounds the insulating material.

17. The method of claim 1, wherein the conductive material formed in the recess comprises at least one of a doped semiconductor material, a metal and a metal nitride.

18. The method of claim 17, wherein the conductive material formed in the recess comprises at least one of doped polysilicon, tungsten, tungsten nitride, tantalum, titanium, and titanium nitride.

19. The method of claim 1, wherein:
a plurality of memory openings extend through the stack in a direction substantially perpendicular to the major surface of the substrate;
each of the plurality of the memory openings includes at least a portion of a semiconductor channel extending substantially perpendicular to the major surface of the substrate in the memory opening;
at least one memory film is located in each of the plurality of the memory openings between the semiconductor channel and the plurality of conductive control gate electrodes; and
forming the mask comprises forming the mask to cover a plurality of first portions of the upper insulating layer of the stack and exposing a plurality of second portions of the upper insulating layer adjacent to each of the plurality of the memory openings.

20. The method of claim 19, wherein etching the upper insulating layer comprises etching the upper insulating layer through the mask to provide a plurality of recesses in the plurality of second portions of the upper insulating layer, each recess adjacent to a respective one of the plurality of memory openings.

21. The method of claim 20, wherein forming the conductive material comprises:
forming a layer of the conductive material over the upper insulating layer and memory openings and within each of the plurality of recesses; and
planarizing the layer of the conductive material to provide a plurality of select gate electrodes adjacent to each of the plurality of the memory openings and separated from one another by the upper insulating layer.

22. The method of claim 1, wherein etching the upper insulating layer comprises etching the upper insulating layer through the mask using a selective reactive ion etching process which does not etch at least the portion of the semiconductor channel exposed in the memory opening.

23. The method of claim 1, further comprising one of a source or drain electrode which contacts the semiconductor channel from above, and another one of a source or drain electrode which contacts the semiconductor channel below the stack to form a monolithic three dimensional NAND string.

24. The method of claim 1, wherein:
- the device comprises a monolithic three dimensional NAND string;
- the semiconductor channel has a U-shaped side cross section;
- two wing portions of the U-shaped semiconductor channel extend substantially perpendicular to a major surface of the substrate are connected by a connecting portion which extends substantially parallel to the major surface of the substrate;
- one of a source or drain electrode which contacts the first wing portion of the semiconductor channel from above; and
- another one of a source or drain electrode which contacts the second wing portion of the semiconductor channel from above.

* * * * *